(12) United States Patent
Chen

(10) Patent No.: US 7,808,405 B1
(45) Date of Patent: Oct. 5, 2010

(54) EFFICIENT BITSTREAM COMPRESSION

(75) Inventor: Zheng Chen, Bethlehem, PA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 61 days.

(21) Appl. No.: 12/413,787

(22) Filed: Mar. 30, 2009

Related U.S. Application Data

(63) Continuation of application No. 11/533,188, filed on Sep. 19, 2006, now Pat. No. 7,511,641.

(51) Int. Cl.
H03M 7/30 (2006.01)
H03K 19/173 (2006.01)

(52) U.S. Cl. .............................. 341/65; 326/38; 326/40; 326/41

(58) Field of Classification Search ................... 341/55, 341/65, 67; 326/38, 40, 41
See application file for complete search history.

(56) References Cited

U.S. PATENT DOCUMENTS

| 3,717,851 | A | * | 2/1973 | Cocke et al. ................. 341/67 |
| 4,560,976 | A | * | 12/1985 | Finn ............................ 341/51 |
| 4,829,475 | A | | 5/1989 | Ward |
| 4,899,149 | A | * | 2/1990 | Kahan ......................... 341/67 |
| 5,099,481 | A | | 3/1992 | Miller |
| 5,467,087 | A | | 11/1995 | Chu |
| 5,805,609 | A | | 9/1998 | Mote |
| 5,953,503 | A | * | 9/1999 | Mitzenmacher et al. ..... 709/203 |
| 6,127,953 | A | | 10/2000 | Manzardo |
| 6,191,710 | B1 | | 2/2001 | Waletzki |
| 6,327,634 | B1 | * | 12/2001 | Statovici ....................... 710/74 |
| 6,525,678 | B1 | * | 2/2003 | Veenstra et al. ............... 341/55 |
| 7,589,648 | B1 | | 9/2009 | Ma et al. |
| 2002/0091905 | A1 | | 7/2002 | Geiger |
| 2005/0229061 | A1 | | 10/2005 | Kang |

OTHER PUBLICATIONS

Koch et al., Hardware Decompression Techniques for FPGA-Based Embedded Systems, ACM Transactions on Reconfigurable Technology and Systems (TRETS), vol. 2, Issue 2 (Jun. 2009) Article No. 9, Year of Publication: 2009, ISSN:1936-7406.*

* cited by examiner

Primary Examiner—Howard Williams

(57) ABSTRACT

In one embodiment of the invention, a method of generating a compressed configuration bitstream for a programmable logic device comprises encoding the most-prevalent data word within the configuration data of the bitstream into a codeword of a first type; encoding a set of more-prevalent data words within the configuration data into codewords of a second type; and including in the compressed bitstream at least some of the data words that are members of the set of more-prevalent data words. The included data words, when received by the programmable logic device, are adapted to be identified by the device as members of the set of more-prevalent data words. The included data words are stored for selection by the device when a codeword of the second type representing an included data word is received by the device.

15 Claims, 4 Drawing Sheets

| Data Words | Codewords |
|---|---|
| Null Data Word (00000000) | 0 |
| Set of More-Prevalent Non-Null Data Words | 10XXXX |
| Set of Less-Prevalent Non-Null Data Words | 11XXXXXXXX |

EFFICIENT BITSTREAM COMPRESSION

RELATED APPLICATION DATA

This application is a continuation of U.S. application Ser. No. 11/533,188, filed Sep. 19, 2006, now U.S. Pat. No. 7,511,641.

TECHNICAL FIELD

The present invention relates generally to data compression and, more particularly, to the compression of bitstreams such as those used to configure programmable logic devices.

BACKGROUND

Programmable logic devices such as field programmable gate arrays (FPGAs) are typically configured by downloading a configuration bitstream into a device's configuration memory. This configuration memory may be either a non-volatile memory such as FLASH or a volatile memory such as SRAM. For a variety of reasons including speed of operation, SRAM-based FPGAs currently dominate the programmable logic device market. As SRAM-based FPGAs continue to grow in complexity, the corresponding amount of SRAM needed to store the configuration data must grow as well. A conventional external non-volatile memory used to boot the configuration data into an SRAM-based FPGA is a Programmable Read Only Memory (PROM). The configuration bitstream from the external boot memory is typically shifted in a serial fashion. These external memories are often relatively expensive such that a compression scheme is desirable so that the configuration data may be stored in smaller (and hence less expensive) external boot memories. There are popular generic compression schemes, such as the Lempel-Ziv-Welch (LZW) algorithm, that may be used to compress configuration data. However, the implementation of the LZW algorithm is complex and resource-intensive. Thus, programmable logic devices such as FPGAs receiving LZW-compressed configuration bitstream devote a considerable amount of die space to the corresponding configuration logic that implements the BZW decompression. Configuration bitstreams may also be compressed based upon the statistical distribution of data words within the bitstreams such as employed in Huffman encoding/decoding techniques. However, the implementation of Huffman decoding for programmable logic devices typically involves the use of external decoders and associated memories. The need for these additional components for Huffman-based compression schemes increases costs and complexity.

Accordingly, there is need in the art for more efficient configuration bitstream compression techniques.

SUMMARY

In one embodiment of the invention, a method of generating a compressed configuration bitstream for a programmable logic device comprises encoding the most-prevalent data word within the configuration data of the bitstream into a codeword of a first type; encoding a set of more-prevalent data words within the configuration data into codewords of a second type; and including in the compressed bitstream at least some of the data words that are members of the set of more-prevalent data words. The included data words, when received by the programmable logic device, are adapted to be identified by the device as members of the set of more-prevalent data words. The included data words are stored for selection by the device when a codeword of the second type representing an included data word is received by the device.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 1a is a table illustrating types of data words and corresponding codewords for an example bitstream compression embodiment;

FIG. 1b illustrates a portion of an uncompressed configuration bitstream and the corresponding portion of a compressed configuration bitstream in accordance with the example embodiment of FIG. 1a;

Embodiments of the present invention and their advantages are best understood by referring to the detailed description that follows. It should be appreciated that like reference numerals are used to identify like elements illustrated in one or more of the figures.

DETAILED DESCRIPTION

Figures 1A, 1B:
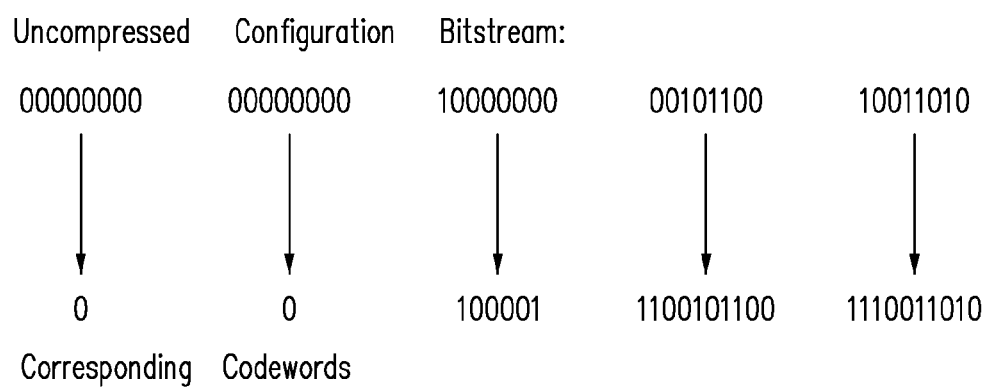

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Because a programmable logic device such as an FPGA must have the flexibility to accommodate a large spectrum of potential uses, any given configuration of an FPGA maps to just a certain percentage of the logic resources. For example, it is common for a given configuration to map to only 30% of the logic resources of an FPGA. For such cases, 70% of the configuration bitstream data would comprise null data words, i.e., data words that configure the unused logic resources to simply remain in a default, non-programmed state. If the configuration bitstream is represented by eight-bit data words (one byte in length, 256 possible combinations), each byte mapping to a non-programmed resource may be represented as the null data word 00000000 (it will be appreciated, however, that the format of the null data word depends upon the particular FPGA protocol being implemented). About 20% of the data words for the configuration bitstream will typically be from a set of just sixteen other data words. For example, eight of these other data words likely have a single binary one such as 10000000, 01000000, 00100000, etc. The remaining 10% of the configuration bitstream data will typically correspond to the other 239 possible data words.

As described previously, generic compression algorithms require complex configuration logic processing circuitry for implementation. The following bitstream compression scheme exploits the statistical distribution of one-byte data words in a configuration bitstream to provide a significant compression ratio using Huffman coding without requiring complex configuration logic. The analysis of the statistical distribution of the data words may be performed externally to the programmable logic device. For example, programmable logic devices are configured using bitstream generators. These bitstream generators convert a user's desired logic into a configuration bitstream such that a corresponding programmable logic device configured with the configuration bitstream is enabled to practice the user's desired logic. Because bitstream generators include abundant processing capabilities, these generators have resources that may be readily programmed or configured to practice the statistical analysis of the configuration bitstream. It will be appreciated, however, that the statistical analysis and resulting compression of the configuration bitstream may be performed by other systems besides a bitstream generator.

With regard to the statistical analysis of the configuration bitstream, the prevalence of the non-null data words in the configuration bitstream is characterized by, for example, the bitstream generator. This analysis identifies a set of non-null data words that occur more commonly in the configuration bitstream as compared to a prevalence of the remaining non-null codewords. As described above, null data words are the most prevalent data word and comprise approximately 70% of typical configuration bitstream data. Assuming that the data words are byte-long words, the remaining set of possible data words in the configuration bitstream includes 255 non-null data words. Despite this relatively large number of possible non-null data words, the bulk (approximately two-thirds) of the non-null data words in a configuration bitstream typically belong to a much smaller set of non-null data words. Statistical analysis of typical bitstreams shows that this smaller set generally comprises no more than sixteen non-null data words. In general, however, the number of data words in a set of more-prevalent data words may vary from sixteen. To perform the following bitstream compression, it is most efficient to have the number of data words in the set of more-prevalent data words correspond to a power of two because the members of the set will be identified by a binary code. In that regard, a set of eight words may prove to be too small whereas a set of thirty-two words may prove to be too large. Thus, the following discussion will assume that the set of more-prevalent data words has sixteen members. Regardless of the number assigned to the set, the statistical analysis of a given configuration bitstream that is to be compressed identifies some or all members in this set. For example, in some embodiments, members of the set may be presumed to be present such as the data words having a single binary one, e.g., 00000001, 00000010, etc. In such embodiments, the statistical analysis would thus identify only the remaining data words in the set of more-prevalent data words whose identity is not presumed. In other embodiments, no data words are presumed to be present in the set such that the statistical analysis identifies all members of this set. Following the statistical analysis, each data word in the configuration bitstream may thus be classified as either a null data word (the most-prevalent data word), a non-null data word belonging to the set of more-prevalent data words, or a non-null data word belonging to a set of less-prevalent data words.

Given the classification of the data words in a configuration bitstream, the configuration bitstream may thus be compressed such that the null data words are represented by a first type of codeword, such as a single-bit codeword. In one embodiment, the single-bit codeword is 0. The set of more-prevalent data words is represented by a second type of codeword. Finally, the set of less-prevalent data words is represented by a third type of codeword. Whereas the first type of codeword is a single bit, both the second and third type of codewords include multiple bits, identified using a two-bit flag. For example, the second type of codeword may be represented by a six-bit codeword 10XXXX, where 10 is a two-bit flag and XXXX is a four-bit binary code that identifies a particular member of the set of more-prevalent data words. For example, 0000 may represent a first one of these data words, 1000 a second, 0100 a third, and so on. In contrast, the third type of codeword may be represented by, for example, a ten-bit codeword (e.g., 11XXXXXXXX) where 11 represents a two-bit flag and XXXXXXXX is an unencoded eight-bit data word that is a member of the set of less-prevalent data words. In that regard, there is no compression but rather data expansion that occurs with regard to members of the set of less-prevalent data words in that each of these data words is simply preceded with a two-bit flag to form the third type of codewords.

Turning now to FIG. 1a, the preceding compression scheme is summarized with regard to the three sets of data words (the most prevalent data word, the more-prevalent data words, and the less-prevalent data words) and the corresponding three types of codewords. A portion of an exemplary configuration bitstream and a corresponding portion of a compressed configuration bitstream are illustrated in FIG. 1b. The configuration bitstream includes two null data words 00000000 that are compressed into codewords 0. The data word 10000000 having a single binary one belongs to the set of more-prevalent data words and is represented by the codeword 100001 that includes the flag of 10 and the four-bit binary code of 0001. The final two data words (00101100 and 10011010) belong the set of less-prevalent data words and are thus repeated in the compressed configuration bitstream but preceded with the flag 11.

As described above, no compression is provided to the 239 data words that belong to the set of less-prevalent data words. Nevertheless, the compression for the set of more-prevalent data words and the null data words (the most-prevalent data word) provides a desirable compression ratio because the average codeword has a length as follows:

$$0.7*1\text{bit}+0.2*6\text{bits}+0.1*10\text{bits}=2.9\text{bits}$$

which corresponds to a compression ratio of 2.76:1. In general, the actual compression ratio will depend upon the prevalence of the null data word and the members of the set of more-prevalent data words in the configuration bitstream for a given design. Experimentation shows that the resulting compression ratio for the compression scheme just describe ranges from 1.75:1 to 4:1. The resulting compression ratio range is thus quite close to that offered by conventional LZW schemes yet avoids the need for complex configuration logic. Instead, a bitstream decompressor need merely identify 0 bits that are not preceded by any flags such as 10 or 11. Each such bit is decompressed into the null word. If the bitstream decompressor identifies the flag 10, the following four bits are used to identify one of the sixteen members of the set of more-prevalent data words. Finally, if the bitstream decompressor identifies the flag 11, the following eight bits are simply the data word. It will be appreciated that other types of flags may be used. Moreover, the set of more-prevalent data words may comprise a different number of data word besides sixteen. For example, the set may comprise eight data words. In such a case, only three bits are needed to identify any member of the set. Thus, such data words could be represented by the codeword 10XXX, where XXX indicates the three bits necessary to identify any member within the set.

The compression scheme just described for configuration bitstream data is independent of the configuration bitstream format. An exemplary bitstream format is described in co-assigned U.S. Pat. No. 6,483,342, which is hereby incorporated by reference. In this exemplary configuration bitstream format, the configuration bitstream begins with a header or preamble frame that may identify the size of the configuration bitstream. For example if the configuration bitstream includes $2^{24}$ or $2^{32}$ bits, it may be denoted as a 24 bit-long or a 32 bit-long bitstream, respectively. An ID frame follows the header frame and identifies the type of device that the bitstream is intended for. The address and data frames then follow the ID frame. Finally, the bitstream ends with a postamble frame.

Given such a format, the ID frame may be used in one embodiment to identify some or all of the members in the set of more-prevalent data words that are compressed into the second type of codewords (such as the six-bit codewords described above). In general, the identity of these data words depends upon the logical design being coded by a particular configuration bitstream. In one embodiment, a bitstream decompressor may use the ID frame to identify members of the set. In alternative embodiments, some or all members of this set may be hardwired into or otherwise pre-stored in the programmable logic device, such as in internal non-volatile memory. For example, as described above, it is common that the eight data words 10000000, 01000000, . . . , 00000001 are within the set of the more-prevalent data words. Other words as well may be safely assumed to be within this set. Thus, in such embodiments, a bitstream decompressor needs only the identity of those words within the set of more-prevalent data words that will vary with a particular configuration bitstream.

The following table describes a header and ID frame format that reserves 40 bits in the ID frame to identify five of these "varying-from-design-to-design" data words in the more-prevalent set:

TABLE 1

| Frame type | codeword | definition |
| --- | --- | --- |
| Header | 11110010 or 11101000 | Preamble in the header that identifies the bitstream length (24 bit or 32 bit, respectively) |
|  | 11111111 | one byte trailing header |
| Frame ID | 0101 1111 1111 1111 | identifies start of frame ID |
|  | 40 reserved bits | identifies five one-byte data words within the set of sixteen more-prevalent data words |
|  | 1-bit compression code | one-bit flag identifying whether the following data frames are compressed |
|  | 3-bit speed code | speed choices for internal clock |
|  | 20-bit Part ID | identifies the type of device to be configured |
|  | 8-bit checksum | error correction |
|  | 1111 1111 | indicates end of frame |

The address and data frames then follow the ID frame, with the data frames containing codewords if the bitstream is compressed and containing data words if the bitstream is uncompressed. Although described within the context of the preceding header and ID frame bitstream format, it will be appreciated that other bitstream formats may be used to perform the same functions.

Figure 2:
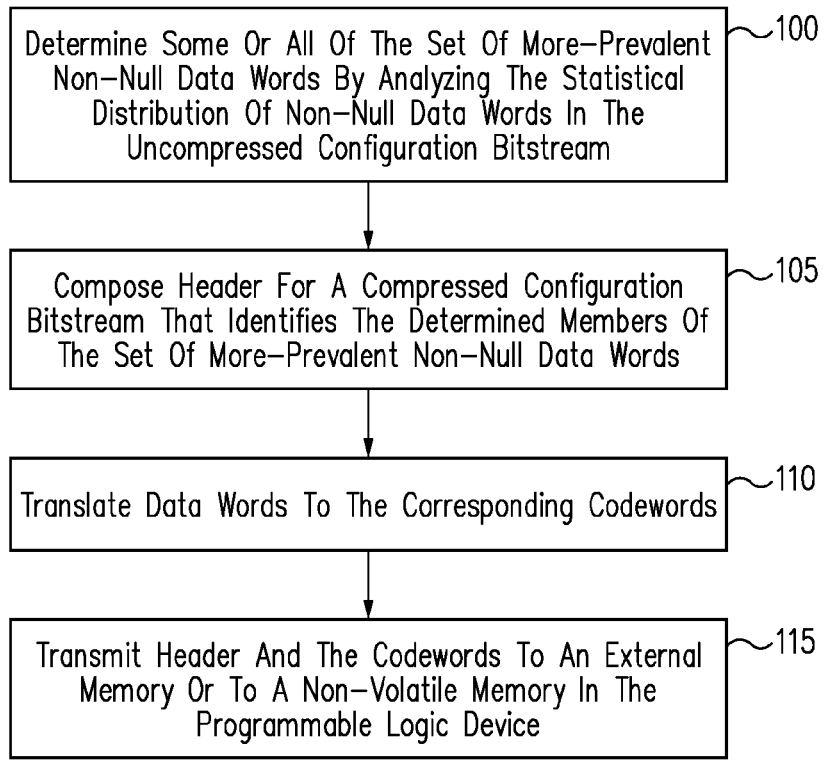
FIG. 2 is a flowchart for an exemplary bitstream compression method.

As described previously, a bitstream generator used to configure programmable logic devices with the appropriate configuration bitstream may be programmed to perform the statistical analysis and to generate a compressed bitstream comprised of the appropriate codewords shown in FIGS. 1a and 1b. This compressed bitstream may be loaded by the bitstream generator into a non-volatile memory from which a programmable logic device receives its configuration data. Alternatively, the bitstream generator may provide the compressed configuration bitstream directly to a programmable logic device. The resulting compression method practiced by a bitstream generator is illustrated in FIG. 2. As known in the art, a bitstream generator generates an uncompressed configuration bitstream based upon a desired logical function that a user wishes to configure a programmable logic device to practice. In a first step 100, a statistical analysis is performed on the uncompressed configuration bitstream to identify the "varying from design-to-design" members of the set of most-prevalent non-null data words. In some embodiments, all members of this set will be considered to vary in this fashion such that the bitstream generator would identify all members of the set in this step. In other embodiments, some members of this set are presumed to be present in this set such as the single binary one words described above (10000000, 01000000, etc.) In such embodiment, only the remaining members of the set of more-prevalent data words are identified in step 100. Thus, step 100 determines some or all of the set depending upon whether members of this set are presumed to be present. In step 105, the bitstream generator composes a header (e.g., one or more frames) such as shown in Table 1 to identify the determined members from step 100. For example, if step 100 identifies five one-byte data words, 40 bits in the header are used to identify these five words. In step 110, the bitstream generator translates the data words in the configuration bitstream into the corresponding codewords as shown in FIGS. 1a and 1b. Finally, in step 115, the bitstream generator transmits the header and the codewords (which together form a compressed configuration bitstream) to a configuration data source such as an external non-volatile memory or a non-volatile memory in the programmable logic device being configured.

Regardless of how a programmable logic device receives its configuration bitstream (either directly from the bitstream generator or from an external memory), such devices will typically include a configuration engine that receives the configuration bitstream and controls the loading of the received bitstream into the programmable logic device's configuration memory. A bitstream decompressor can be included in the configuration engine without requiring an excessive amount of die area as compared to conventional LZW-based bitstream decompressors. Moreover, no external components are required as is the case for conventional Huffman-decoding-based bitstream decompressors.

Figure 3:
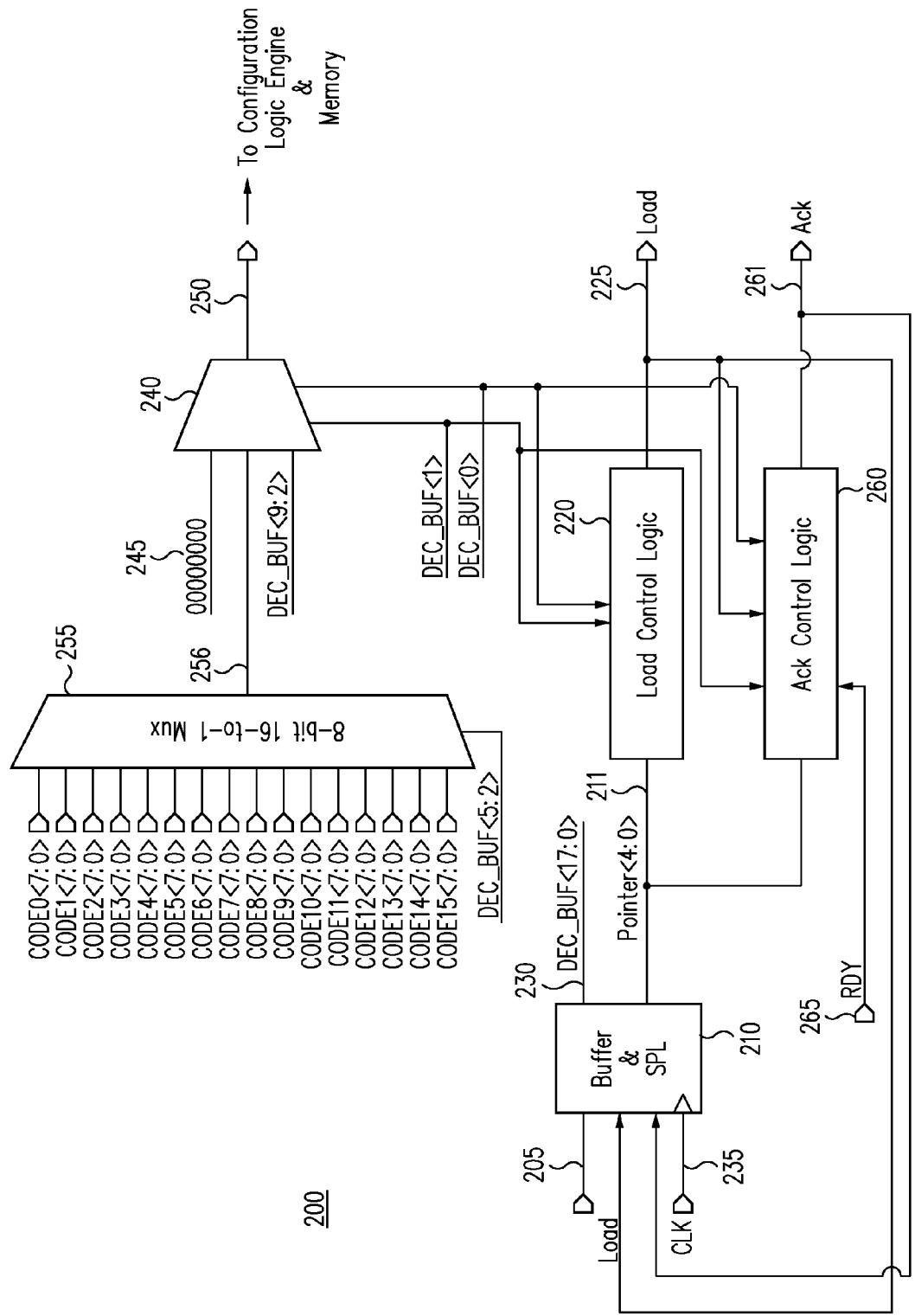
FIG. 3 is a block diagram of an example bitstream decompressor

Turning now to FIG. 3, an exemplary bitstream decompressor 200 will now be described. Operation of bitstream decompressor 200 may be better understood with regard to the following features inherent to a Huffman-based compression scheme: whereas the codewords to be decompressed are of variable length (for example, 1-bit, 6-bit, or 10-bit in length), the corresponding data words are of constant length (such as one byte). In one embodiment, bitstream decompressor 200 receives a compressed configuration bitstream at an input bus 205. This compressed configuration bitstream arrives on a word-by-word basis such as one-byte words. Should input 205 receive an all-zero byte word (representing eight code words of the first type), bitstream decompressor will output eight null data words at an output port 250 to a downstream configuration memory (not illustrated). Conversely, should input 205 receive two bytes that include a ten-bit codeword of the third type, bitstream decompressor 200 will output a single data word at output 250. Thus, the rate of incoming bytes varies from the rate of outgoing bytes at bitstream decompressor 200. To accommodate such variability, bitstream decompressor 200 includes a buffer 210. Buffer 210 stores incoming bytes on input 205 in an internal memory the contents of which are represented by a signal DEC_BUF 230. The number of bits in signal DEC_BUF (and hence the width of the memory in buffer 210) may differ in various embodiments of buffer 210, but it may be seen that a width of one byte would be too small. For example, to store and decode the codeword 11XXXXXXXX, two additional bits are still necessary to complete the 10-bit uncompressed codeword indicated by the header of 11. Thus, DEC_BUF should be at least two bytes in width if input bus 205 is one-byte wide. However, even a two-byte width may lead to delays as can be seen from the following example. Suppose a two-byte-wide DEC_BUF is filled with a six-bit codeword and a ten-bit codeword. The six-bit codeword may be shifted out and decoded at an initial clock cycle of a clock 235. However, another byte cannot be shifted into DEC_BUF because only six bits would be available. In contrast, an eighteen-bit-wide DEC_BUF would accommodate the incoming byte without delay. Thus, it may be shown that a minimum buffer width of 18 bits provides un-delayed operation. In that regard, the following description assumes that the contents of the internal memory in buffer 210 may be represented as the eighteen bit-wide signal DEC_BUF <17:0>.

Buffer 210 may include shifter and pointer logic (SPL) 210 to assist its operation. Bytes of compressed codewords are received at input 205 and shifted into the buffer by the SPL responsive to cycles of clock 235. The SPL controls the shifting such that the first two bits in DEC_BUF identify the current compressed codeword to be decoded. For example, DEC_BUF <0> equaling zero indicates that the current codeword to be decoded is the first type of codeword described with regard to FIGS. 1*a* and 1*b* (a one-bit codeword denoting a compressed null data word). Bitstream decompressor 200 should thus provide a null data word at output 250 to decode such a codeword. Conversely, if DEC_BUF <0> equals one and the following bit DEC_BUF <1> equals one, the current codeword to be decoded is a member of the second type of codeword (six-bit codewords representing members of the set of more-prevalent data words). In such a case, the next four bits (DEC_BUF <5:2>) indicate which member of the set of more-prevalent data words should be provided at output 250. Alternatively, if both DEC_BUF <0> and DEC_BUF <1> equal one, the current codeword to be decoded is the third type of codeword (10-bit codeword). In such a case, the next eight bits (DEC_BUF <9:2> indicate which member of the set of less-prevalent data words should be provided at output 250.

Should DEC_BUF <0> equal one and DEC_BUF <1> equal zero (indicating that the current codeword to be decoded is the second type of codeword), the four following bits designated by DEC_BUF<5:2> control a multiplexer 255 to select the appropriate member of the set of more-prevalent data words. This set is represented by signals CODE0<7:0> through CODE15<7:0>. Multiplexer 255 provides the selected member as an output signal 256. The identity of some or all of the signals CODE0 through CODE15 may be transmitted to the bitstream decompressor circuit using an ID frame should the configuration data be formatted as described with regard to the Table 1. In such embodiments, the configuration engine includes hard-wired logic that stores the identified data words in the ID frame into device memory so that multiplexer 255 may select from these stored words as the appropriate members of signals CODE0 through CODE15. Alternatively, some or all of these signals could be hard-wired in the programmable logic device or pre-stored in an internal non-volatile memory. For example, should CODE0 represent the commonly-used codeword 10000000, bit CODE0<7> may be tied to VCC whereas bits CODE0<6:0> would all be tied to ground. Alternatively, the programmable logic device incorporating the bitstream decompressor could include a non-volatile memory that could be pre-programmed to include at least some of the members of the set of more-prevalent data words.

SPL 210 provides a pointer signal 211 that indicates the amount DEC_BUF must shift by in the cycle of clock 235 so that appropriate control bits are received at DEC_BUF <1:0>. For example, should eight zeroes (corresponding to eight one-bit codewords) have been shifted in from the input bus to DEC_BUF <7:0>, the contents of DEC_BUF should shift by just one bit at each clock cycle. This one bit shift is indicated by the state of the pointer signal, which is received by a load control logic circuit 220 as well as an acknowledgement control logic circuit 260. The load control logic circuit controls the state of a load signal 225 that indicates whether a downstream configuration logic engine may receive one-byte data word from output 250. The load signal is also received by the SPL. The acknowledgement control logic circuit controls the state of an acknowledgment (ACK) signal 261 responsive to the state of a ready (RDY) signal 265 and the pointer signal. The RDY signal determines whether a next byte of the compressed configuration bitstream is available at input bus 205 from the configuration data source. In turn, the ACK signal controls whether the configuration data source may place a next byte of compressed configuration bitstream onto the input bus. Both the load control logic circuit and the acknowledgment control logic circuit are also dependent upon the value of DEC_BUF <1:0>.

Operation of bitstream decompressor 200 may be better understood with respect to the following examples. If DEC_BUF<0> equals zero, a null data word 245 is selected by a multiplexer 240 and provided to output 250. Downstream configuration logic receives the data word at output 250 when the load signal indicates that the data word is ready. The pointer signal equals one and the contents of DEC_BUF are shifted by one and the process repeated until DEC_BUF<0> no longer equals zero. Note again that the pointer signal indicates the bit position where the next codeword begins in the buffer (its position in the data represented by DEC_BUF). This position can be as large as seventeen to indicate the bit represented by DEC_BUF<17>. Thus, the pointer signal will correspond to a five-bit wide signal Pointer<4:0> for embodiments in which DEC_BUF is eighteen bits wide.

Should DEC_BUF <0> equal one and DEC_BUF <1> equal zero after the contents of DEC_BUF are shifted, multiplexer 240 selects for its output 256 the appropriate member of the set of more-prevalent data words represented by signals CODE0 through CODE15. The SPL then drives Pointer <4,0> to equal six such that at the next clock cycle, the contents of DEC_BUF <17,6> becomes DEC_BUF <11,0>.

Should DEC_BUF <0> equal one and DEC_BUF <1> equal one after the shifting of DEC_BUF, multiplexer 240 selects for the data word contained in the buffer as bits DEC_BUF <9:2>. This selected data word belongs to the set of less-prevalent data words. The SPL then drives Pointer <4,0> to equal 10 such that at the next clock cycle, the contents of DEC_BUF <17,10> becomes DEC_BUF <8,0>.

It will be appreciated that bitstream decompressor 200 may be constructed using numerous alternative configurations that achieve the equivalent results. It will be further appreciated that multiplexers 240 and 255 form a Huffman decoder for decoding the codeword stored in the buffer that begins at the bit position DEC_BUF<0>.

Figure 4:
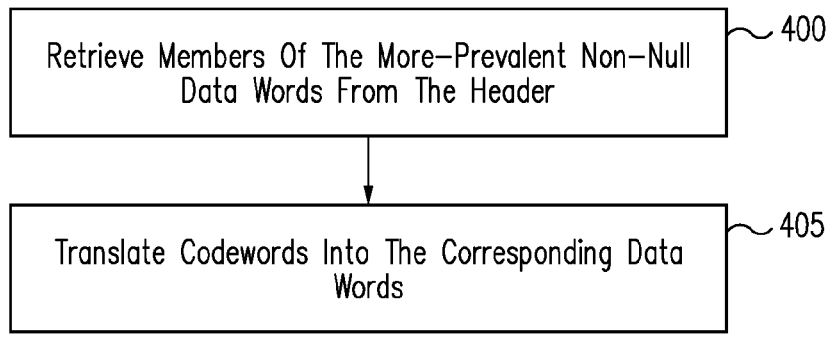
FIG. 4 is a flowchart for an exemplary bitstream decompression method.

The bitstream decompression method practiced by bitstream decompressor 200 is summarized in a flowchart shown in FIG. 4. In a step 400, the bitstream decompressor retrieves the varying-from-design-to-design members of the set of more-prevalent data words from the header. These retrieved members then form the appropriate members of signals CODE0 through CODE15 described with regard to multiplexer 255 of FIG. 3. Being thus configured with the full set of the more-prevalent data words, the bitstream decompressor may proceed to decode the codewords in the compressed configuration bitstream into the corresponding data words in step 405.

Figure 5:
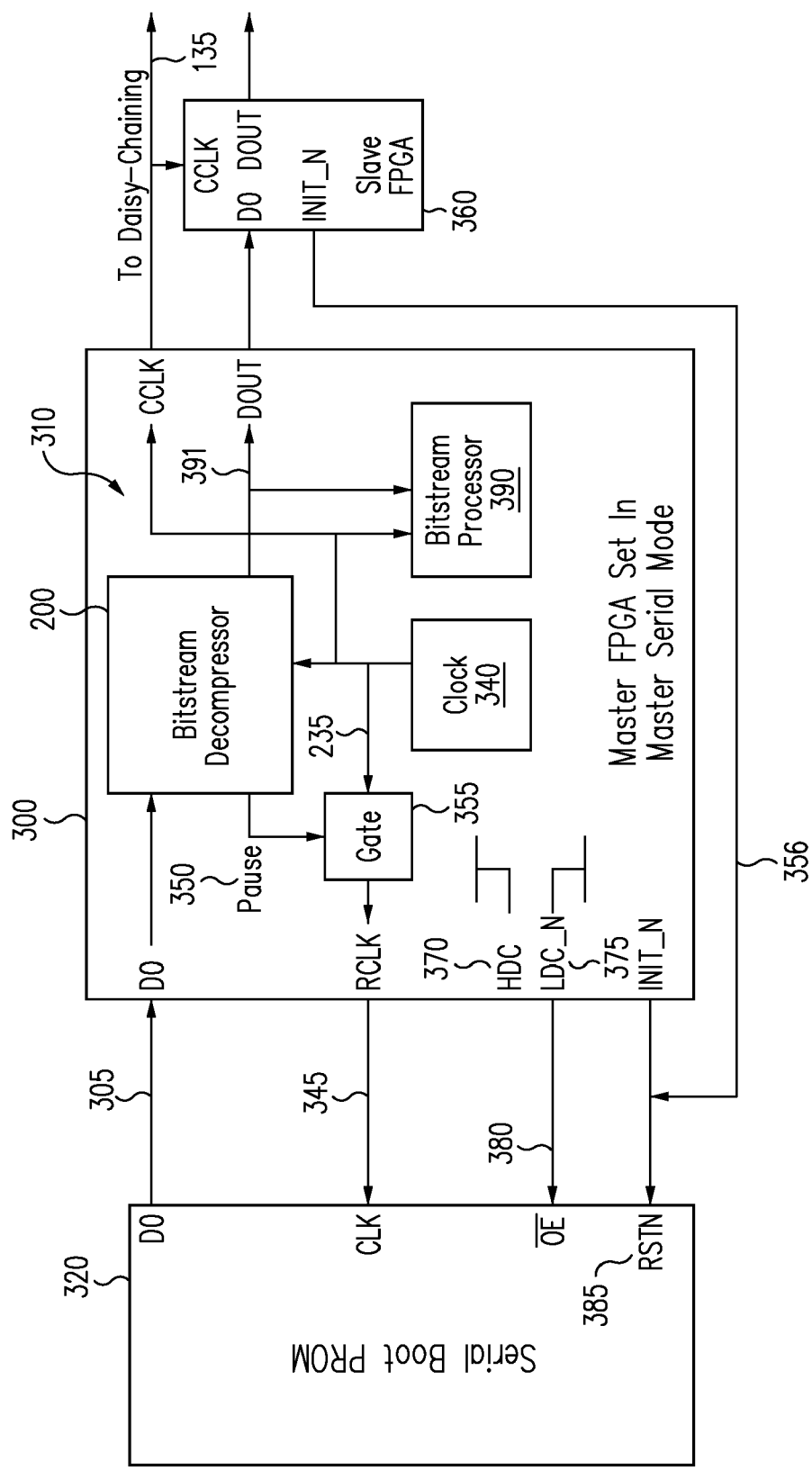
FIG. 5 is a block diagram of an example master FPGA configured to decompress a compressed configuration bitstream from a PROM and provide a decompressed configuration bitstream to optional daisy-chained slave FPGAs.

The incorporation of bitstream decompressor 200 into the configuration logic of a programmable logic device such as an FPGA will now be addressed. For example, the bitstream decompressor may be used for a master FPGA in a serial configuration mode with daisy-chained slave FPGAs. Turning now to FIG. 5, a master FPGA 300 includes a configuration logic engine 310. Master FPGA 300 controls the configuration of one or more daisy-chained slave FPGAs such as a slave FPGA 360 in a conventional master/slave fashion. As also known in the art, a configuration logic engine such as engine 210 is "hardwired" in that it should be up and running prior to configuration of the master FPGA. To implement the advantageous compression scheme described herein, the configuration logic engine includes a bitstream decompressor 200 such as described with regard to FIG. 3. A serial boot PROM 320 provides the compressed configuration bitstream as an output signal DO 305, which is received by the bitstream decompressor at its input bus 205 (FIG. 3). Thus, the bitstream decompressor has the logic to recognize the end of the ID frame and whether compression has been used. Because the bitstream decompressor identifies whether compression has been used directly from DO signal 305 (such as from the ID frame), no external pin need be dedicated in the master FPGA to a compression flag signal. The bitstream decompressor may have the set of more-prevalent data words hard-wired or stored in non-volatile memory (not illustrated). Alternatively, the bitstream decompressor may receive the identity of some or all of these data words from the ID frame received in the DO signal.

During operation, the bitstream decompressor decodes the codeword 0 to the null data word 00000000, the codeword 10XXXX to the corresponding member of the set of more-prevalent data words, and the codeword 11XXXXXXXX to the corresponding member XXXXXXXX of the set of less-prevalent data words as described above. The bitstream decompressor controls the rate of the incoming codewords from the PROM using the ACK signal as also described earlier. The bitstream decompressor is clocked by internal clock signal 235 from a clock circuit 340. Should there be no compression of the configuration data, the internal clock is sent unchanged as a read clock (RCLK) 345 that clocks the serial output of the configuration bitstream data DO from a source of configuration data such as PROM 320. However, should the bitstream decompressor have to decode codewords in the DO signal, the internal clock rate may be too fast to allow for the required processing. Thus, the bitstream decompressor may assert the ACK signal to prevent the clocking of the PROM by the read clock RCLK. For example, the ACK signal (which may also be denoted as a pause signal 350) may drive a gate circuit 355 that gates the internal clock from driving the read clock RCLK. If the pause signal is not asserted, then the gate circuit allows the internal clock to pass through as the read clock RCLK. The serial DO signal may be read from the PROM at a given edge of the read clock such as the rising edge. As known in the art, an initialization signal (INIT_N) 356 may be asserted by the master and slave FPGAs when these devices are ready to receive their configuration bitstreams. In such an embodiment, the PROM may respond to the initialization signal as an active low reset (RSTN) signal 385. Either a high-during-configuration (HDC) signal 30 or a low-during-configuration signal (LDC_N) 375 may be used as a chip select or an output enable (OE) signal 380 for the PROM.

Having decoded the codewords, the bitstream decompressor provides a serial output signal (DOUT) 391 (the decompressed configuration bitstream) to a bitstream processor 390. As known in the art, processor 390 controls the shifting of the configuration bitstream into the configuration memory (not illustrated) of the master FPGA. After the master has been configured, the decompressed bitstream is provided to the slave FPGA, which includes a configuration logic engine (not illustrated) that controls its configuration in the conventional fashion. After its configuration, the slave FPGA may then couple the decompressed bitstream to additional downstream daisy-chained slave devices (not illustrated). It will be appreciated that the bitstream decompression described with regard to master FPGA 300 may also be implemented in a stand-alone FPGA that is not daisy-chained with any slave FPGAs.

Embodiments described above illustrate but do not limit the invention. For example, it will be appreciated that other implementations are also contemplated by the present disclosure. It should also be understood that numerous modifications and variations are possible in accordance with the principles of the present invention. Moreover, no limitations from the specification are intended to be read into any claims unless those limitations are expressly included in the claims. Accordingly, the scope of the invention is defined by the following claims.

I claim:

1. A method of generating a compressed configuration bitstream for a programmable logic device, comprising:

encoding the most-prevalent data word within the configuration data of the bitstream into a codeword of a first type;

encoding a set of more-prevalent data words within the configuration data into codewords of a second type having a fixed length, wherein such codewords have fewer bits than the data words they represent; and including in the compressed bitstream at least some of the data words that are members of the set of more-prevalent data words, wherein the included data words, when received by the programmable logic device, are adapted to be identified by the device as members of the set of more-prevalent data words and stored for selection by the device when a codeword of the second type representing an included data word is received by the device.

2. The method of claim 1, wherein the most-prevalent data word is the null data word.

3. The method of claim 1, wherein the first type of codeword is a single-bit codeword.

4. The method of claim 1, wherein the set of more-prevalent data words is no more than sixteen data words.

5. The method of claim 1, wherein the set of more-prevalent data words includes the data words with a single "1" bit therein.

6. The method of claim 1, wherein the second type of codeword includes a flag identifying the codeword type and a code identifying an associated data word within the set of more-prevalent data words.

7. The method of claim 1, wherein including data words that are members of the set of more-prevalent data words comprises inserting the data words at a location in the bitstream reserved for identifying such data words.

8. The method of claim 1 including encoding a set of less-prevalent data words within the configuration data into codewords of a third type.

9. The method of claim 8, wherein the third type of codeword includes a flag identifying the codeword type and a body containing a data word within the set of less-prevalent data words.

10. A computer-readable medium on which is stored a computer program for generating a compressed configuration bitstream for a programmable logic device, the steps of the program comprising:

encoding the most-prevalent data word within the configuration data of the bitstream into a codeword of a first type;

encoding a set of more-prevalent data words within the configuration data into codewords of a second type having a fixed length, wherein such codewords have fewer bits than the data words they represent; and including in the compressed bitstream at least some of the data words that are members of the set of more-prevalent data words, wherein the included data words, when received by the programmable logic device, are adapted to be identified by the device as members of the set of more-prevalent data words and stored for selection by the device when a codeword of the second type representing an included data word is received by the device.

11. A configuration bitstream containing configuration data encoded therein, the bitstream including:

at least some of data words that are members of a set of more-prevalent data words;

a first type of codeword that encodes the most-prevalent data word in the configuration data;

a second type of codeword having a fixed length that encodes the set of more-prevalent data words in the configuration data, wherein such codewords have fewer bits than the data words they represent, wherein the included data words, when received by the programmable logic device, are adapted to be identified by the device as members of the set of more-prevalent data words and stored for selection by the device when a codeword of the second type representing an included data word is received by the device.

12. The configuration bitstream of claim 11, wherein the configuration bitstream includes:

an ID frame containing the data words that are members of the set of more-prevalent data words; and one or more data frames following the ID frame and containing codewords of the first and second types.

13. The configuration bitstream of claim 12, wherein the ID frame contains a flag identifying whether the following data frames are compressed.

14. A method of decompressing a configuration bitstream within a programmable logic device, the method comprising:

receiving a configuration bitstream in the programmable logic device;

storing in the device data words included in the configuration bitstream that are members of a set of more-prevalent data words in the configuration data;

decoding a codeword of a first type into the most-prevalent data word in the configuration data;

decoding codewords of a second type having a fixed length into data words that are members of the set of more-prevalent data words, wherein such codewords have fewer bits than the data words they represent; and retrieving, in response to decoding a codeword of the second type, a stored data word included in the configuration bitstream.

15. The method of claim 14, wherein the configuration bitstream includes:

an ID frame containing the data words that are members of the set of more-prevalent data words; and one or more data frames following the ID frame and containing codewords of the first and second types.

* * * * *